(12) United States Patent
Lee et al.

(10) Patent No.: US 12,188,988 B2
(45) Date of Patent: Jan. 7, 2025

(54) APPARATUS AND METHOD FOR EVALUATING BATTERY STATE OF CHARGE

(71) Applicants: HYUNDAI MOTOR COMPANY, Seoul (KR); KIA MOTORS CORPORATION, Seoul (KR); CLARIOS GERMANY GmbH & Co. KGaA, Hannover (DE)

(72) Inventors: Young-Kug Lee, Hwaseong-si (KR); Ki-Seon Ryu, Seoul (KR); Jae-Eun Jin, Incheon (KR); Jong-Dae Kim, Anyang-si (KR); Ingo Koch, Hannover (DE); Jorn Albers, Hannover (DE)

(73) Assignees: HYUNDAI MOTOR COMPANY, Seoul (KR); KIA MOTORS CORPORATION, Seoul (KR); CLARIOS GERMANY GMBH & CO. KG, Hannover (DE)

( * ) Notice: Subject to any disclaimer, the term of this patent is extended or adjusted under 35 U.S.C. 154(b) by 713 days.

(21) Appl. No.: 16/702,930

(22) Filed: Dec. 4, 2019

(65) Prior Publication Data
US 2020/0217898 A1 Jul. 9, 2020

(30) Foreign Application Priority Data
Jan. 8, 2019 (KR) .................... 10-2019-0002183

(51) Int. Cl.
*G01R 31/388* (2019.01)
*B60L 3/12* (2006.01)
(Continued)

(52) U.S. Cl.
CPC .............. *G01R 31/388* (2019.01); *B60L 3/12* (2013.01); *B60L 58/10* (2019.02); *B60L 58/12* (2019.02);
(Continued)

(58) Field of Classification Search
CPC .. G01R 31/388; G01R 31/367; G01R 31/386; G01R 31/392; G01R 31/382;
(Continued)

(56) References Cited

U.S. PATENT DOCUMENTS

2008/0231284 A1 9/2008 Birke et al.
2011/0127831 A1* 6/2011 Skarani ................. G06F 1/3212
                                                                    307/10.7
(Continued)

FOREIGN PATENT DOCUMENTS

JP          2009-0513991 A     4/2009
KR     10-2009-0192212 A     12/2009
(Continued)

OTHER PUBLICATIONS

Korean Office Action dated Nov. 27, 2023,, issued in corresponding Korean Patent Application No. 10-2019-0002183 with English tranlation.

*Primary Examiner* — Farhana A Hoque
*Assistant Examiner* — Joseph O Nyamogo
(74) *Attorney, Agent, or Firm* — Morgan, Lewis & Bockius LLP

(57) ABSTRACT

An apparatus for estimating a battery state of charge includes a computer that determines a lifespan of a battery by creating test conditions for the battery by reflecting predetermined driving information of a vehicle and then performing the test conditions; and a tester that performs charging according to predetermined charging conditions and discharging according to predetermined discharging conditions on the battery in accordance with the test conditions.

19 Claims, 5 Drawing Sheets

(51) Int. Cl.
*B60L 58/10* (2019.01)
*B60L 58/12* (2019.01)
*B60L 58/16* (2019.01)
*G01R 31/367* (2019.01)
*G01R 31/382* (2019.01)
*G01R 31/385* (2019.01)
*G01R 31/392* (2019.01)

(52) U.S. Cl.
CPC ............ *B60L 58/16* (2019.02); *G01R 31/367* (2019.01); *G01R 31/382* (2019.01); *G01R 31/386* (2019.01); *G01R 31/392* (2019.01); *Y02T 10/70* (2013.01)

(58) Field of Classification Search
CPC .. B60L 58/10; B60L 3/12; B60L 58/12; B60L 3/0046; B60L 58/16; Y02T 10/70
See application file for complete search history.

(56) References Cited

U.S. PATENT DOCUMENTS

| | | | | |
|---|---|---|---|---|
| 2011/0178654 | A1* | 7/2011 | Bauerle | H01M 10/42 |
| | | | | 701/2 |
| 2013/0085695 | A1* | 4/2013 | Ono | H01M 10/48 |
| | | | | 702/63 |
| 2013/0181684 | A1* | 7/2013 | Ueki | H02J 7/00 |
| | | | | 320/162 |
| 2013/0307334 | A1* | 11/2013 | Middleton | G01R 31/392 |
| | | | | 307/31 |
| 2016/0288651 | A1* | 10/2016 | Kinoshita | B60L 50/15 |
| 2017/0038436 | A1 | 2/2017 | Montaru | |
| 2018/0149702 | A1* | 5/2018 | Lee | G01R 31/3842 |
| 2018/0183254 | A1* | 6/2018 | Park | H02J 7/0071 |

FOREIGN PATENT DOCUMENTS

| | | |
|---|---|---|
| KR | 10-2014-0093552 A | 7/2014 |
| KR | 10-2016-0007870 A | 1/2016 |
| KR | 10-2016-0062468 A | 6/2016 |
| WO | 2012/114036 A1 | 8/2012 |
| WO | 2014/0029647 A1 | 2/2014 |

\* cited by examiner

APPARATUS AND METHOD FOR EVALUATING BATTERY STATE OF CHARGE

CROSS-REFERENCE TO RELATED APPLICATION

This application claims priority to Korean Patent Application No. 10-2019-0002183 filed on Jan. 8, 2019, which is incorporated herein by reference in its entirety.

TECHNICAL FIELD

The present disclosure relates to a technology of managing an automotive battery, and more particularly, to an apparatus and a method for evaluating a battery state of charge, the apparatus and method simulating the use amount of an automotive battery in engine-on/off states according to an increase in the battery use amount.

BACKGROUND

In general, a battery management system uses a method of estimating a state of charge (SOC) through coulomb counting to determine the SOC of a battery. Such a method of estimating an SOC uses a nominal capacity reference, but an actual capacity reference changes with temperature, so using a nominal capacity reference may cause an error by coulomb counting.

Further, a method of finding out in advance the relationship between an SOC and factors such as internal resistance, temperature, and a discharged current, detecting at least two factors, and detecting an SOC corresponding to the detected factors is used.

However, it is difficult to measure an accurate SOC even though a relationship between the SOC and an Open Circuit Voltage (OCV) is known because there is a difference in characteristic, depending on a charged state, a discharged state, and the degree of deterioration of a battery.

SUMMARY OF THE DISCLOSURE

The present disclosure has been made in an effort to solve the problems of the related art and an object of the present disclosure is to provide an apparatus and a method for estimating a battery state of charge, the apparatus and method simulating the use amount of an automotive battery in engine-on/off states according to an increase in the battery use amount.

In order to achieve the objects described above, the present disclosure provides an apparatus for estimating a battery state of charge, the apparatus simulating the use amount of an automotive battery in engine-on/off states according to an increase in the battery use amount.

An apparatus for estimating a battery state of charge according to an aspect of the present disclosure includes: a computer that determines a lifespan of a battery by creating test conditions for the battery by reflecting predetermined driving information of a vehicle and then performing the test conditions; and a tester that performs charging according to predetermined charging conditions and discharging according to predetermined discharging conditions on the battery in accordance with the test conditions.

The test conditions may include a main micro-cycle that performs discharging and recharging after discharging for a predetermined first specific time.

The main micro-cycle may perform discharging for a predetermined second specific time for discharging acceleration, may perform charging until the battery is charged with a predetermined charging amount, may repeat a sub-micro-cycle that sequentially performs discharging and charging with a predetermined specific number of repetitions, performs discharging for a predetermined third specific time, and then may have a rest period for a predetermined fourth specific time.

The sub-micro-cycle may perform discharging for a predetermined fifth specific time and then may perform charging for a predetermined sixth specific time.

The sub-micro-cycle may be repeated for a predetermined seventh specific time when an energy use amount is smaller than a predetermined reference value, and the main micro-cycle may be performed when the energy use amount is the same as or larger than the reference value.

The amount of discharging may be determined through discharging coulomb counting, and the amount of charging may be determined through charging coulomb counting and reflects vehicle characteristics.

The test conditions may progress after an engine of the vehicle is turned off.

The energy use amount may be any one of a State Of Charge (SOC), a State Of Health (SOH), a Depth Of Discharging (DOD), a State Of Function (SOF), and a charging voltage.

The battery may be positioned in a chamber having a predetermined temperature for a predetermined eighth specific time.

The battery may be a fully charged fresh battery that has not been used for any test before.

The driving information may include driving mode information of the vehicle, electrical load information, Idle Stop and Go (ISG) entrance information, and ISG removal information.

According to another aspect of the present disclosure, a method of estimating a battery state of charge includes: a computer determining a lifespan of a battery by creating test conditions for the battery by reflecting predetermined driving information of a vehicle and then performing test conditions; a tester performing charging according to predetermined charging conditions and discharging according to predetermined discharging conditions on the battery in accordance with the test conditions; and the computer determining a lifespan of the battery in accordance with results of the charging and discharging.

According to the present disclosure, it is possible to estimate a battery state of charge simulating actual conditions through a test room estimation by simulating the use amount of an automotive battery in engine-on/off states according to an increase in the battery use amount.

Further, according to the present disclosure, it is possible to estimate aging of a battery within a short time by accelerating durability test of the battery.

DESCRIPTION OF SPECIFIC EMBODIMENTS

Figure 1:
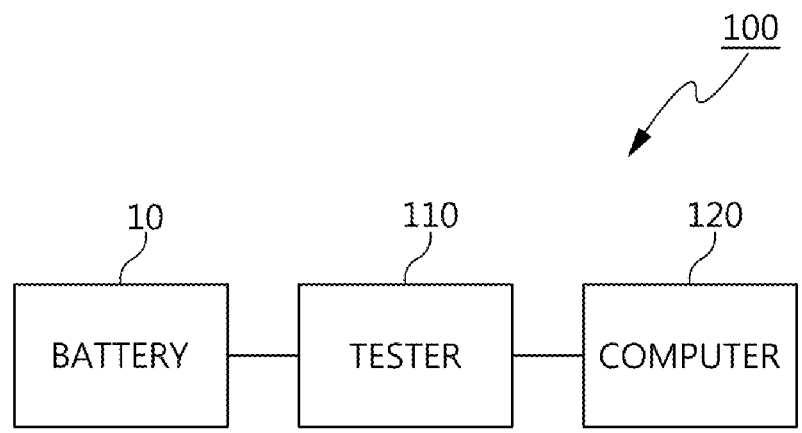
FIG. 1 is a block diagram showing the configuration of an apparatus for estimating a battery state of charge according to an exemplary embodiment of the present disclosure.

The present disclosure may be modified in various ways and implemented by various exemplary embodiments, so that specific exemplary embodiments are shown in the drawings and will be described in detail in the following detailed description. However, it is to be understood that the present disclosure is not limited to the specific exemplary embodiments, but includes all modifications, equivalents, and substitutions included in the spirit and the scope of the present disclosure.

Reference numerals are assigned to reference components in the following description of drawings. Terms used in the specification, 'first', 'second', etc., may be used to describe various components, but the components are not to be construed as being limited to the terms. The terms are used to distinguish one component from another component.

For example, the 'first' component may be named the 'second' component, and vice versa, without departing from the scope of the present disclosure. The term 'and/or' includes a combination of a plurality of related and described items or any one of a plurality of related and described terms.

Unless otherwise defined, all terms including technical and scientific terms used herein have the same meaning as commonly understood by those skilled in the art to which the present disclosure belongs.

It will be further understood that terms used herein should be interpreted as having a meaning that is consistent with their meaning in the context of this specification and the relevant art and will not be interpreted in an idealized or overly formal sense unless expressly so defined herein.

Hereafter, an apparatus and method for evaluating a battery state of charge according to an exemplary embodiment of the present disclosure is described in detail with reference to the accompanying drawings.

FIG. 1 is a block diagram showing the configuration of an apparatus for estimating a battery state of charge according to an exemplary embodiment of the present disclosure. Referring to FIG. 1, an apparatus 100 for estimating a battery state of charge may include a tester 110 that tests a battery 10 and a computer 120 that transmits test conditions to the tester 110 and receives and processes result information according to the test conditions. The tester 110 may include a processor, computer, microprocessor, a Central Processing Unit (CPU), etc.

The battery 10 includes battery cells (not shown) arranged in series and/or in parallel and the battery cells may be automotive high-voltage battery cells such as a nickel metal battery cell, a lithium ion battery cell, a lithium polymer battery cell, and a solid-state battery cell. In general, a high-voltage battery is a battery that is used as a power source for driving a vehicle and the high voltage means voltage of 100V or more. However, the present disclosure is not limited thereto and a low-voltage battery cell may be used. The battery 10 may be a unit battery including one battery cell. In particular, the battery 10 is a fully charged fresh battery that has not been used for any test before.

The tester 110 can be controlled by the computer 120 to charge and discharge the battery 10. In detail, it is possible to charge or discharge the battery by controlling currents flowing into and out of the battery 10. Accordingly, the tester 110 can charge or discharge the battery on the basis of the test conditions, and in this process, the tester 110 can charge or discharge the battery on the basis of an input value of the test conditions. The tester 110 may include a chamber (not shown) or a water bath at 25° C. in which the battery 10 is put and environment conditions such as temperature and humidity are performed. The tester 110 may be configured separately from the chamber. The chamber can be maintained at 25±2° C. for 24 hours.

The computer 120 determines the lifespan of the battery 10 by creating test conditions for the battery 10 by reflecting driving information of a vehicle and then performing the test conditions. The driving information may be characterized by including driving mode information of a vehicle, electrical load information, Idle Stop and Go (ISG) entrance information, ISG removal information, etc.

That is, the computer 120 performs simulation using driving information of a vehicle that is obtained through test that are repeated several times and performs simulation of an energy use amount in an engine-on state and simulation of an energy use amount in an engine-off state. The simulation of an energy use amount in an engine-on state is simulation of an energy use amount when power generation control, actual estimation data of an Idle Start and Go (ISG) system, etc. are used. Further, the simulation of an energy use amount in an engine-off state is simulation of an energy use amount when a dashboard camera is used.

Accordingly, the computer 120 simulates an energy use amount such as a State Of Charge (SOC), a State Of Health (SOH), a Depth Of Discharging (DOD), a State Of Function (SOF), and a charging voltage. When a vehicle speeds up, that is, when a driver pushes an accelerator pedal, a battery may be discharged. In detail, when a driver presses down an accelerator pedal, torque may be generated at an ISG motor as assistant power for an engine (not shown). In this process, a battery electrically connected to the ISG motor may be discharged to operate the ISG motor.

On the other hand, when a vehicle speeds down, that is, when a driver presses down a brake pedal, a battery may be charged. In detail, when a driver presses down a brake pedal, the ISG motor may generate reverse torque and may store regenerative energy in the battery. Accordingly, the battery can be charged.

When a vehicle is completely stopped (idling), the engine is stopped. Accordingly, the ISG motor is not operated and there is no energy that is charged in or discharged from the battery. When a dashboard camera is installed, the dashboard camera has to monitor the states inside and outside a vehicle, so it continuously operates. Accordingly, the battery is discharged.

The energy use amount is obtained through simulation, but a user may set the energy use amount in person by setting environments. The simulation, for example, may be computer simulation software such as a MATLAB Simulink-based ADVISOR and V-ELPH.

Figure 2A:
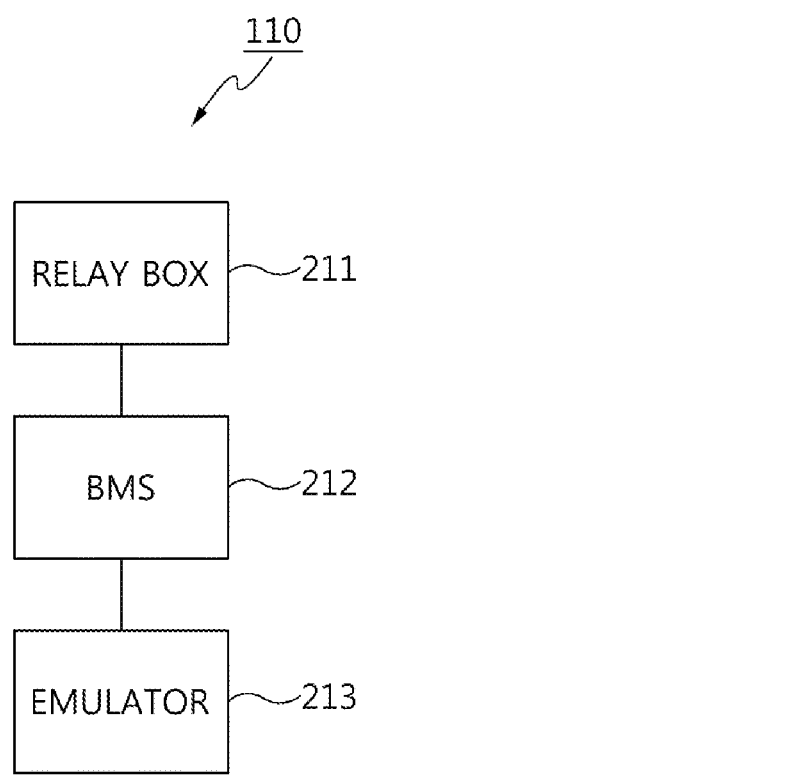
FIG. 2A is a block diagram showing the configuration of a tester shown in FIG. 1.

FIG. 2A is a block diagram showing the detailed configuration of the tester 110 shown in FIG. 1. The tester 110 charges and discharges the battery 10 in accordance with simulation of the computer 120 and measures current, voltage, temperature, etc. of the battery 10 according to the charging and discharging. Referring to FIG. 2A, the tester 110 may include a relay box 211, a Battery Management System (BMS) 212, an emulator 213, etc.

The relay box 211 performs a function of connecting or disconnecting power of the battery 10 to or from the emulator 213. The relay box 211 may include a switching circuit etc. A power relay is used as the switching circuit, but the present disclosure is not limited thereto, and a Field Effect Transistor (FET), a Metal Oxide Semiconductor FET (MOSFET), an Insulated Gate Bipolar Mode Transistor (IGBT), a semiconductor switching element such as a power rectifying diode, a thyristor, a Gate Turn-Off (GTO) thyristor, a Triode for alternating current (TRIAC), an Silicon Controlled Rectifier (SCR), an Integrated Circuit (I.C), etc. may be used. In particular, as for the semiconductor element, a bipolar, power Metal Oxide Silicon Field Effect Transistor (MOSFET) etc. may be used. The power MOSFET has a Double-Diffused Metal Oxide Semiconductor (DMOS) structure that is operated at high voltage and high current different from common MOSFETs.

The emulator 213 charges and discharges the battery 10 in accordance with simulation from the computer 120. That is, the emulator performs charging and discharging, which corresponds to driving mode information, electrical load information, Idle Stop and Go (ISG) entrance information, ISG removal information, etc., on the battery 10. The emulator 213 may include a charger, an electric load, a converter, etc.

The BMS 212 continuously monitors the state of the battery 10 and transmits the monitoring information to the computer 120. For this monitoring, the BMS 212 measures voltage, temperature, and current of the battery 10 in real time, calculates an State Of Charge (SOC), a State Of Health (SOH), a Depth Of Discharging (DOD), a State Of Function (SOF), and an energy use amount such as a charging voltage on the basis of the measured data, and transmits the information to the computer 120.

The BMS 212 may include a current sensor, a voltage sensor, a temperature sensor, etc. Further, the BMS 212 may receive information about the battery 10 from the computer 120.

Figure 2B:
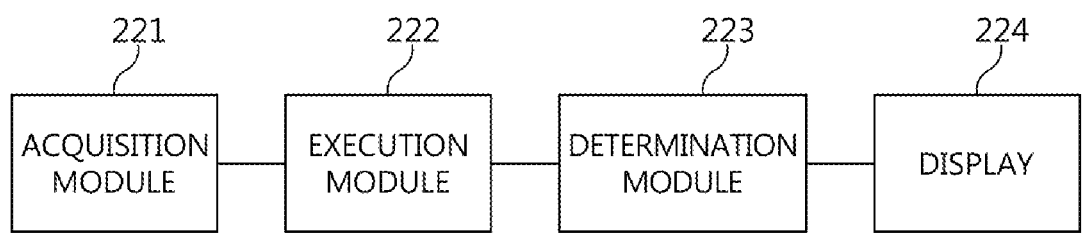
FIG. 2B is a block diagram showing the configuration of a computer shown in FIG. 1.

FIG. 2B is a block diagram showing the configuration of the computer 120 shown in FIG. 1. Referring to FIG. 2B, the computer 120 includes an acquisition module 221, an execution module 222, a determination module 223, a display 224, etc. The acquisition module 221 acquires driving information of a vehicle for simulation. Further, the acquisition module 221 creates test conditions for the battery 10 by reflecting driving information of the vehicle.

The execution module 222 performs a function of executing the test conditions created by reflecting the driving information of the vehicle.

The determination module 223 performs a function of determining the lifespan of the battery 10 on the basis of the result executed by the execution module 222.

The display 224 performs a function of displaying the determination result. The display 224 displays an environment setting image such as test conditions, an information service image, resultant information, etc. The display 224 may be an Liquid Crystal Display (LCD), an Light Emitting Diode (LED) display, an Organic Light Emitting Diode (OLED) display, a touch screen, a flexible display, a Head Up Display (HUD), etc.

Further, the term "module" and the like shown in FIG. 2B embodies a unit for processing at least one function or operation and may be implemented by a combination of hardware and/or software. The hardware may be implemented as an application specific integrated circuit (ASIC), digital signal processing (DSP), a programmable logic device (PLD), a field programmable gate array (FPGA), a processor, a controller, a microprocessor, other electronic units, or a combination thereof, all of which is designed in order to perform the above-mentioned functions. The software may be implemented as a module performing the above-mentioned functions. The software may be stored in a memory unit and is executed by a processor. The memory unit or the processor may adopt various units that are well known to those skilled in the art.

Figure 3:
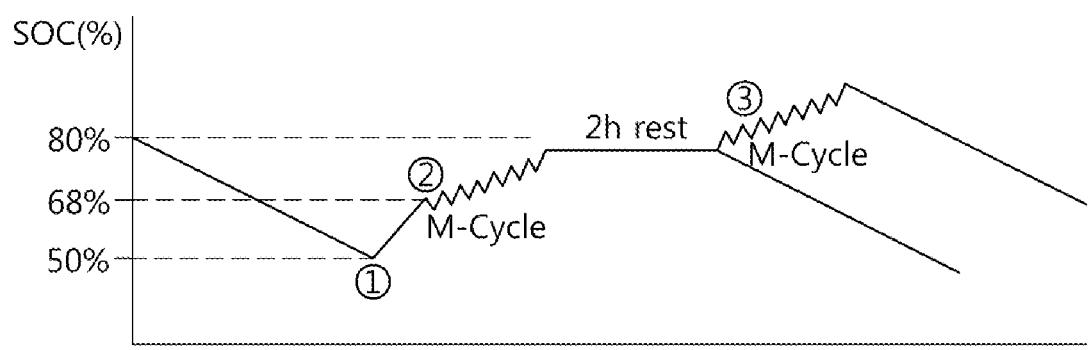
FIG. 3 is a conceptual diagram of a test profile according to an exemplary embodiment of the present disclosure.

FIG. 3 is a conceptual diagram of a test profile according to an exemplary embodiment of the present disclosure. Referring to FIG. 3, the graph is composed of ① a discharging point, ② a recharging point, and ③ a sub-micro cycle (M-cycle) point. That is, ①, ②, and ③ sequentially progress. In particular, aging of the battery is determined at ①. That is, when the battery voltage is about 11.5V or less after the ② sub-micro cycle is performed, end of a lifespan is determined. A rest cycle (about 2 hours) exists between ② and ③. This process is shown in a table, as follows, for easy understanding.

TABLE 1

| Battery size | Discharging | Recharging (M-cycle) | Rest | M-cycle | Total time |
|---|---|---|---|---|---|
| 90 Ah | 3 A*9 h | ☐ 1 h | 2 h | 1 h or 0 h | 13 h or 12 h |
| 70 Ah | 3 A*7 h | ☐ 1 h | 2 h | 1 h or 0 h | 11 h or 10 h |

Ah is Ampere-hour, A is Ampere, and h is hour.

A dashboard camera is not used in the description referring to FIG. 3, but this process can be applied even though a dashboard camera is used. When a dashboard camera is used, discharging due to use of the dashboard camera is generated before the ① discharging point. Further, discharging due to use of the dashboard camera is generated even after the ③ M-cycle point. In the rest cycle, a current charging amount is shown by converting an OCV measured in accordance with an OCV (Open Circuit Voltage)-SOC map into an SOC.

The sawtooth waves show M-cycling of charging and discharging in FIG. 3. That is, 68%~80% of the SOC are repeated several times. The M-cycling shows a Start-Stop operation during cycling.

Further, although the SOC is used in FIG. 3, but a DOD may be used.

Figure 4:
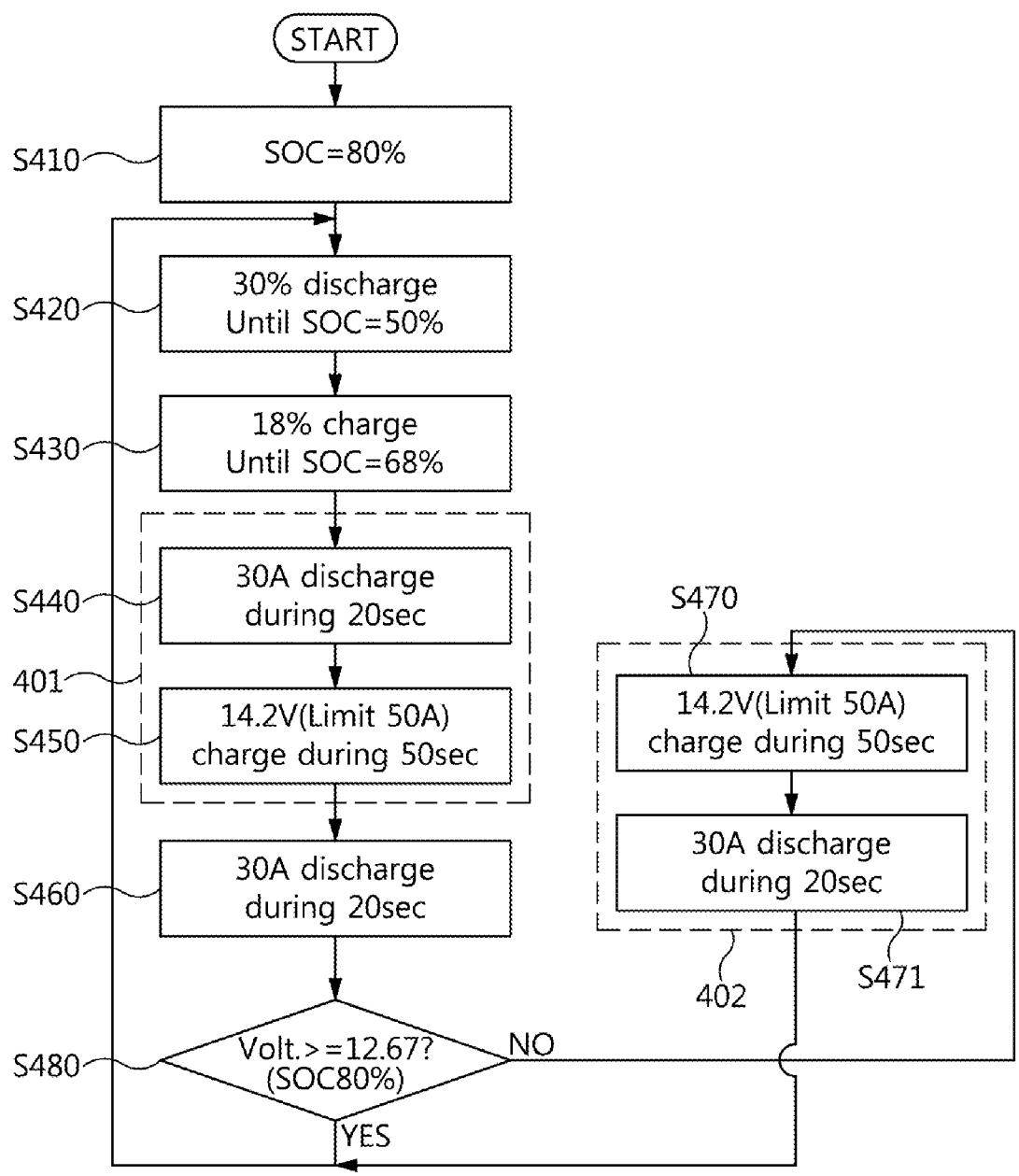
FIG. 4 is a flowchart showing a process of estimating durability acceleration according to an exemplary embodiment of the present disclosure.

FIG. 4 is a flowchart showing a process of estimating durability acceleration according to an exemplary embodiment of the present disclosure. Referring to FIG. 4, the process is started from about 80% of the SOC of the battery 10, discharging (30%) is performed until the SOC of the battery 10 becomes 50%, and then charging (18%) is performed until the SOC becomes 68% again (steps S410, S420, and S430). In this case, the amount of discharging is determined through discharging coulomb counting, the amount of charging is determined through charging coulomb counting and reflects vehicle characteristics.

Thereafter, a first sub-micro-cycle 401 is performed (steps S440 and S450). That is, discharging is performed at 30A for 20 seconds and then charging is performed at 14.2V for 50 seconds (50A limit) (steps S440 and S450). The first sub-micro-cycle 401 may be repeated.

Thereafter, discharging is performed at 30A for 20 seconds and then whether the measured voltage of the battery 10 is about 12.67V or more is determined (steps S460 and S480). That is, whether the SOC is 80% or more is determined.

As the determination result, in step S480, when the measured voltage is not about 12.67V or more, a second sub-micro-cycle 402 is performed. That is, discharging is performed at 30A for 20 seconds and then charging is performed at about 14.2V for 50 seconds (steps S440 and S450). Thereafter, step S480 progresses again. The first sub-micro-cycle 401 and the second sub-micro-cycle 402 are the same, but are distinguished for understanding.

Unlike, in step S480, when the measured voltage is about 12.67V or more, steps S420 to S480 progress again. That is, when the SOC is smaller than 80%, recharging is performed over 1 hour and then the cycle is continued, but one hour of micro-cycling finally will lead to an increase of SOC of the battery. When the SOC is 80% or more, the cycle (that is, steps S420 through S480) is continued. Steps S420 to S480 are main micro-cycle to distinguish the sub-micro-cycles 401 and 402.

As shown in FIG. 4, according to the method of estimating durability acceleration, discharging is performed until the SOC of the battery becomes about 50% (=about 12.24V) after the engine of the vehicle is stopped, and then charging is performed. In this case, a discharging condition is to perform discharging until the SOC becomes 50% (=12.24V). The charging condition is to perform charging at about 14.2V (limit: 50 A).

In particular, the test conditions in FIG. 4 are as follows.

The SOC is 50→68% by constant voltage charge during cycling without Start-Stop.

Recharging voltage is generally 14.2V as inside a vehicle.

Discharging is applied to battery size/nominal capacity.

There is no refresh mode during cycling.

The process shown in FIG. 4 may be applied as the following table.

TABLE 2

| Battery size | 50 Ah | 60 Ah | 70 Ah | 80 Ah | 90 Ah | 105 Ah |
|---|---|---|---|---|---|---|
| Time (hr) | 5 | 6 | 7 | 8 | 9 | 10.5 |
| amount of charge (Ah) | 9.0 | 10.8 | 12.6 | 14.4 | 16.2 | 18.9 |
| number of repetitions (n) | 16 | 18 | 20 | 23 | 25 | 28 |

Figure 5:
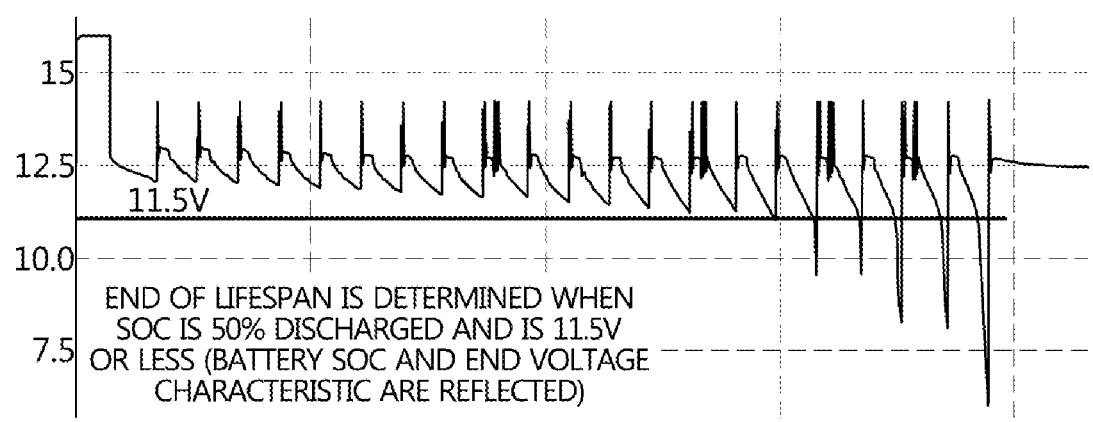
FIG. 5 is a conceptual diagram for determining a battery lifespan end according to an exemplary embodiment of the present disclosure.

FIG. 5 is a conceptual diagram for determining a battery lifespan end according to an exemplary embodiment of the present disclosure. Referring to FIG. 5, when the battery voltage is about 11.5V or less after a cycle of charging and discharge is performed, end of the lifespan of the battery 10 is determined.

Figure 6:
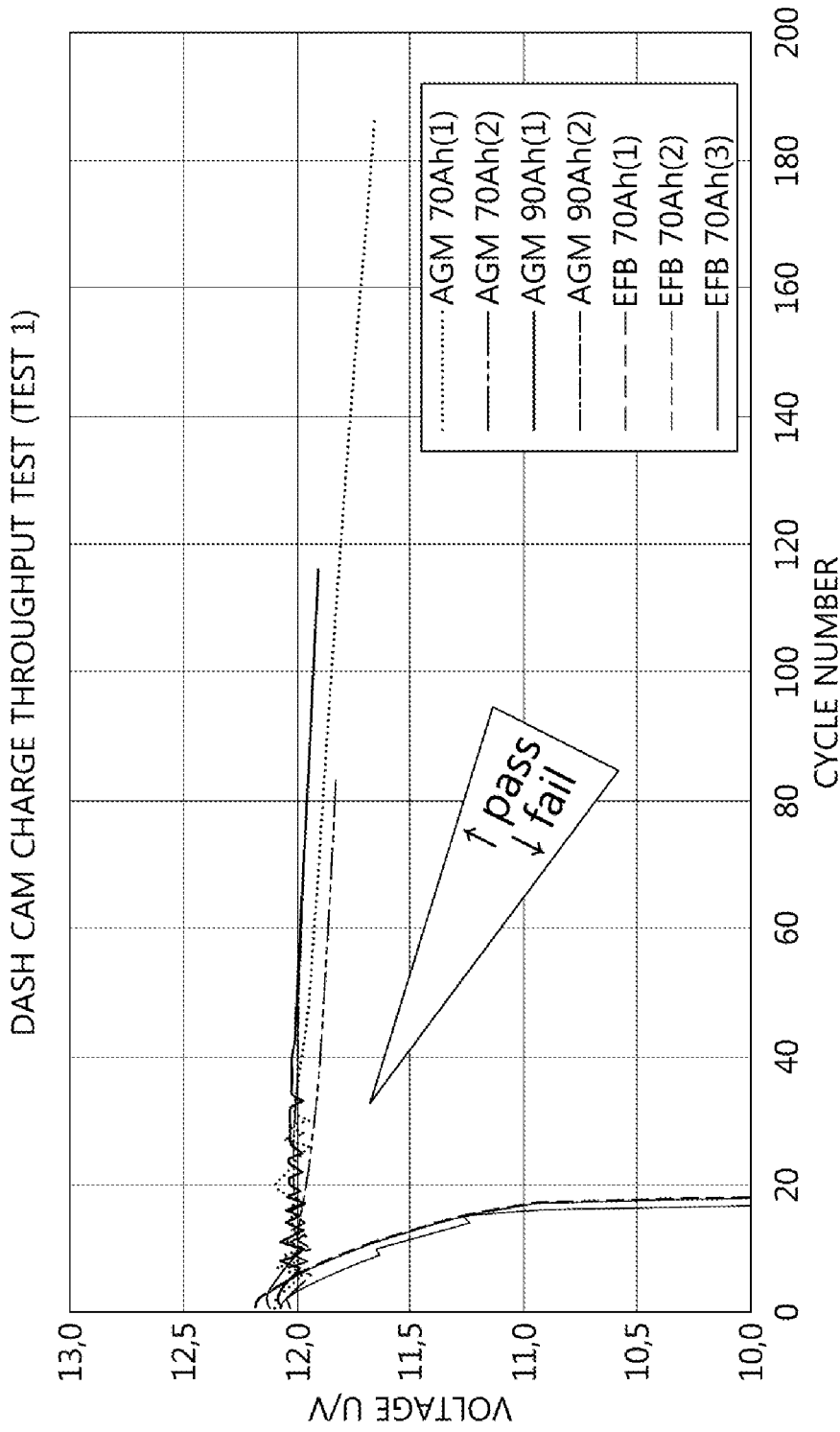
FIG. 6 is a conceptual diagram for defining a lifespan end determination reference according to estimation of durability acceleration according to an exemplary embodiment of the present disclosure.

FIG. 6 is a conceptual diagram for defining a lifespan end determination reference according to estimation of durability acceleration according to an exemplary embodiment of the present disclosure. Referring to FIG. 6, determination of end of a lifespan considering the quality and characteristics of the battery after 100 cycles is about 11.5V. Accordingly, when it is smaller than about 11.5V, it means 'fail', and when it is larger than 11.5V, it means 'pass'. The AGM means an Absorbed Glass Mat battery. The EFB means an Enhanced Flooded Battery.

The steps of the method and algorithms described in relation to the embodiments described herein may be implemented in the format of program commands, which can be executed through various computer units, and may be recorded on computer-readable media. The computer-readable media may include program (command) codes, data files, data structures, etc., or a combination thereof.

The program (command) codes that are recorded on the media may be those specifically designed and configured for the present disclosure or may be those available and known to those engaged in computer software in the art. The computer-readable media, for example, may include magnetic media such as a hard disk, a floppy disk, and a magnetic tape, optical media such as a CD-ROM, a DVD, and a blu-ray disc, and semiconductor memory devices specifically configured to store and execute program (command) codes such as a ROM, a RAM, and a flash memory.

The program (command) codes include not only machine language codes compiled by a compiler, but also high-level language codes that can be executed by a computer using an interpreter. The hardware device may be configured to operate as one or more software modules to perform the operation of the present disclosure, and vice versa.

What is claimed is:

1. An apparatus for estimating a battery state of charge, the apparatus comprising:
    a computer that determines a lifespan of a battery by creating test conditions to simulate a use amount of the battery in engine-on/off states according to an increase in a battery use amount for the battery by reflecting predetermined driving information of a vehicle and then performing the test conditions; and
    a tester that performs charging according to predetermined charging conditions and discharging according to predetermined discharging conditions on the battery in accordance with the test conditions to estimate aging of the battery within a preset short time by accelerating durability test of the battery,
    wherein the simulation of the use amount of the battery in engine-on state is simulation of an energy use amount when power generation control or actual estimation data of an Idle Start and Go (ISG) system are used, the simulation of an energy use amount in an engine-off state is simulation of an energy use amount when a camera is used, the discharging is performed until the use energy amount becomes half after the engine of the vehicle is stopped, and then the charging is performed and the use energy amount of the battery and end voltage characteristic are reflected.

2. The apparatus of claim 1, wherein the test conditions include a main micro-cycle that performs discharging and recharging after discharging for a predetermined first time.

3. The apparatus of claim 2, wherein the main micro-cycle performs discharging for a predetermined second time for discharging acceleration, performs charging until the battery is charged with a predetermined charging amount, repeats a sub-micro-cycle that sequentially performs discharging and charging with a predetermined specific number of repetitions, performs discharging for a predetermined third time, and then has a rest period for a predetermined fourth time.

4. The apparatus of claim 3, wherein the sub-micro-cycle performs discharging for a predetermined fifth time and then performs charging for a predetermined sixth time.

5. The apparatus of claim 4, wherein the sub-micro-cycle is repeated for a predetermined seventh time when an energy use amount is smaller than a predetermined reference value, and
    wherein the main micro-cycle is performed when the energy use amount is the same as or larger than the reference value.

6. The apparatus of claim 5, wherein the energy use amount is any one of a State Of Charge (SOC), a State Of Health (SOH), a Depth Of Discharging (DOD), a State Of Function (SOF), and a charging voltage.

7. The apparatus of claim 1, wherein an amount of discharging is determined through discharging coulomb counting, and an amount of charging is determined through charging coulomb counting and reflects vehicle characteristics.

8. The apparatus of claim 1, wherein the test conditions progress after an engine of the vehicle is turned off.

9. The apparatus of claim 1, wherein the battery is positioned in a chamber having a predetermined temperature for a predetermined eighth time, and the battery is a fully charged fresh battery that has not been used for any test before.

10. The apparatus of claim 1, wherein the driving information includes driving mode information of the vehicle, electrical load information, Idle Stop and Go (ISG) entrance information, and ISG removal information.

11. A method of estimating a battery state of charge, the method comprising:
   determining, by a computer, a lifespan of a battery by creating test conditions to simulate a use amount of the battery in engine-on/off states according to an increase in a battery use amount for the battery by reflecting predetermined driving information of a vehicle and then performing the test conditions;
   performing, by a tester, charging according to predetermined charging conditions and discharging according to predetermined discharging conditions on the battery in accordance with the test conditions to estimate aging of the battery within a preset short time by accelerating durability test of the battery; and
   determining, by the computer, a lifespan of the battery in accordance with results of the charging and discharging, wherein the simulation of the use amount of the battery in engine-on state is simulation of an energy use amount when power generation control or actual estimation data of an Idle Start and Go (ISG) system are used, the simulation of an energy use amount in an engine-off state is simulation of an energy use amount when a camera is used, the discharging is performed until the use energy amount becomes half after the engine of the vehicle is stopped, and then the charging is performed and the use energy amount of the battery and end voltage characteristic are reflected.

12. The method of claim 11, wherein the test conditions include a main micro-cycle that performs discharging and recharging after discharging for a predetermined first time.

13. The method of claim 12, wherein the main micro-cycle performs discharging for a predetermined second time for discharging acceleration, performs charging until the battery is charged with a predetermined charging amount, repeats a sub-micro-cycle that sequentially performs discharging and charging with a predetermined specific number of repetitions, performs discharging for a predetermined third time, and then has a rest period for a predetermined fourth time.

14. The method of claim 13, wherein the sub-micro-cycle performs discharging for a predetermined fifth time and then performs charging for a predetermined sixth time.

15. The method of claim 14, wherein the sub-micro-cycle is repeated for a predetermined seventh time when an energy use amount is smaller than a predetermined reference value, and
   wherein the main micro-cycle is performed when the energy use amount is the same as or larger than the reference value.

16. The method of claim 11, wherein an amount of discharging is determined through discharging coulomb counting, an amount of charging is determined through charging coulomb counting and reflects vehicle characteristics.

17. The method of claim 11, wherein the test conditions progress after an engine of the vehicle is turned off.

18. The method of claim 15, wherein the energy use amount is any one of a State Of Charge (SOC), a State Of Health (SOH), a Depth Of Discharging (DOD), a State Of Function (SOF), and a charging voltage.

19. The method of claim 11, wherein the battery is positioned in a chamber having a predetermined temperature for a predetermined eighth time, and the battery is a fully charged fresh battery that has not been used for any test before.

* * * * *